(12) United States Patent
Meng et al.

(10) Patent No.: US 7,692,269 B2
(45) Date of Patent: Apr. 6, 2010

(54) VERTICAL ORGANIC TRANSISTOR

(75) Inventors: Hsin-Fei Meng, Hsinchu (TW);
Sheng-Fu Horng, Hsinchu (TW);
Yu-Chiang Chao, Bade (TW)

(73) Assignee: National Chiao Tung University, Hsinchu (TW)

( * ) Notice: Subject to any disclaimer, the term of this patent is extended or adjusted under 35 U.S.C. 154(b) by 283 days.

(21) Appl. No.: 11/675,140

(22) Filed: Feb. 15, 2007

(65) Prior Publication Data
US 2008/0128681 A1 Jun. 5, 2008

(30) Foreign Application Priority Data
Dec. 1, 2006 (TW) .............................. 95144663 A

(51) Int. Cl.
*H01L 27/082* (2006.01)
(52) U.S. Cl. ................. 257/592; 257/40; 257/E29.044; 257/E29.124; 438/350
(58) Field of Classification Search ................. 257/592, 257/E29.044
See application file for complete search history.

(56) References Cited

U.S. PATENT DOCUMENTS

| | | | |
|---|---|---|---|
| 5,563,424 A | 10/1996 | Yang et al. | |
| 6,774,052 B2 | 8/2004 | Vogeli et al. | |
| 6,884,093 B2 | 4/2005 | Baldo et al. | |
| 7,002,176 B2 | 2/2006 | Iechi et al. | |
| 2004/0100319 A1* | 5/2004 | Pennock et al. | 327/407 |
| 2004/0232408 A1* | 11/2004 | Heeger et al. | 257/40 |
| 2006/0145144 A1* | 7/2006 | Lee et al. | 257/40 |
| 2007/0138463 A1* | 6/2007 | Herlogsson et al. | 257/40 |

OTHER PUBLICATIONS

N. Stutzmann, et al, Self-Aligned, Vertical-Channel, Polymer Filed-Effect Transistors, Science, vol. 299, Mar. 21, 2003.
R. Parashkov, et al, Vertical Channel All-Organic Thin Film Transistors, Applied Physics Letters, vol. 82, No. 25, Jun. 23, 2003.
M.S. Meruvia, et al, Organic-metal-semiconductor Transistor With High Gain, Applied Physics Letters, vol. 84, No. 20, May 17, 2004.
W.Shockley, Transistor Electronics: Imperfections, Unipolar and Analog Transistors, Proceedings Of The I.R.E., 1289 (1952).

(Continued)

*Primary Examiner*—Tu-Tu V Ho
(74) *Attorney, Agent, or Firm*—Muncy, Geissler, Olds & Lowe, PLLC

(57) ABSTRACT

A vertical organic transistor and a method for fabricating the same are provided, wherein an emitter, a grid with openings and a collector are sequentially arranged above a substrate. Two organic semiconductor layers are interposed respectively between the emitter and the grid with openings and between the grid with openings and the collector. The channel length is simply decided by the thickness of the organic semiconductor layers. The collector current depends on the space-charge-limited current contributed by the potential difference between the emitter and the openings of the grid. And the grid voltage can thus effectively control the collector current. Further, the fabrication process of the vertical organic transistor of the present invention is simple and exempt from using the photolithographic process.

9 Claims, 15 Drawing Sheets

OTHER PUBLICATIONS

Y. Yang, et al, A New Architecture For Polymer Transistors, Nature, vol. 372, Nov. 24, 1994.

J. McElvain, et al, Fullerene-based Polymer Grid Triodes, J. Appl. Physics, vol. 81 No. 9, May 1, 1997.

Kazuhiro Kudo, et al, Fabrication And Device Characterization Of Organic Light Emitting Transistors, Thin Solid Films, 438-439 (2003) 330-333.

* cited by examiner

VERTICAL ORGANIC TRANSISTOR

BACKGROUND OF THE INVENTION

1. Field of the Invention

The present invention relates to an organic transistor, particularly to a vertical organic transistor structure and a method for fabricating the same.

2. Description of the Related Art

The organic field effect transistor is an indispensable organic electronic element. The structure of the general organic field effect transistor is similar to that of the conventional field effect transistor made of an inorganic semiconductor material, wherein a gate is formed on a substrate; an insulating layer and an organic semiconductor layer are deposited above the gate; then a source and a drain are formed on an identical plane above the organic semiconductor layer. The operating mode of an organic field effect transistor is that an external voltage is applied to the gate to induce a current channel inside the organic semiconductor, and current can thus flow from the source to the drain via the current channel.

As an organic semiconductor generally has a lower carrier mobility than an inorganic semiconductor, it is characterized in low response speed and small current modulation range. To solve the problem, many researches proposed higher carrier mobility organic semiconductors. For example, someone reduced the distance between the source and the drain to increase the drain current. A photolithographic technology is needed to reduce the distance between the source and the drain to a sub-micron dimension. However, the process and solution used in the photolithographic technology are likely to deteriorate organic semiconductors.

Some prior arts proposed schemes to solve the difficulty in obtaining a short channel length between the source and the drain, such as "Self-Aligned, Vertical-Channel, Polymer Field-Effect Transistors" by Stutzmann et al., and "Vertical Channel All-Organic Thin-Film Transistor" by Becker et al., wherein the source and the drain are arranged in vertical direction and separated by an insulating layer; then, a trench is fabricated chemically or mechanically to contain an organic semiconductor layer, an insulating layer and the gate. In such an element, the distance between the source and the drain is determined by the thickness of the insulating layer, and current flows vertically. However, such an element is hard to fabricate because the fabrication of the trench has to use a complex chemical or mechanical method.

Meruvia et al. disclosed a method to change the structure of elements. Similar to a metal base transistor, the element comprises an emitter, a base and a collector, wherein the emitter is made of an organic semiconductor; the base is made of gold; and the collector is made of silicon. This method utilizes the energy gap between the emitter and the base to generate hot electrons and controls the base current to modulate the collector current. However, the collector is made of silicon in this method. Therefore, this method cannot meet the requirement of soft electronics.

A paper "Transistor Electronics: Imperfections, Unipolar and Analog Transistors" by Shockley proposed a scheme: the cathode of a vacuum tube is simulated via forming a heavily-doped cylindrical region in the central portion of a solid semiconductor cylinder; the grid electrode of the vacuum tube is simulated via forming a plurality of heavily-doped cylindrical regions around the cathode; the carrier-receiving plate electrode of the vacuum tube is simulated via forming a heavily-doped cylindrical shell along the perimeter of the solid semiconductor cylinder. As this scheme adopts silicon or germanium as material, it is hard to meet the requirement of soft electronics. Besides, this scheme is also hard to realize with the semiconductor technology.

Yang et al., McElvain et al., and a U.S. Pat. No. 5,563,424 disclosed "Polymer Grid Triodes", wherein three electrodes are separated by two polymer layers. The operating mode thereof is similar to a vacuum tube: a first electrode injects electrons, and the voltage of a second electrode is used to control the current reaching a third electrode, wherein the current flows in the direction vertical to the substrate. In this design, the second electrode needs treating by a chemical method. Thus, the selectivity of the polymer layer is limited. Besides, the fabrication process thereof is pretty complicated.

Kudo et al. and a U.S. Pat. No. 7,002,176 disclosed a "Vertical Organic Transistor", wherein three electrodes are separated by two organic layer, and current flows in the direction vertical to the substrate. The second electrode is fabricated with a vapor deposition mask and a dual-source vapor deposition method, wherein the grid electrode geometry formed on a sample is controlled via adjusting the distance between the mask and the sample, the distances between the mask and the vapor deposition sources, the distance between two vapor deposition sources and the distance between the patterns of the mask. The abovementioned method is very complicated and hard to define a very fine boundary of the grid electrode.

A U.S. Pat. No. 6,774,052 disclosed a "Method of Making Nanotube Permeable Base Transistor", wherein carbon nanotubes are grown on a semiconductor to function as a gate, and a semiconductor material is vapor-deposited on the carbon nanotubes to function as a collector. As this method adopts inflexible materials, it cannot meet the requirement of soft electronics.

A U.S. Pat. No. 6,884,093 disclosed "Organic Triodes with Novel Grid Structures and Method of Production". As this method needs an expensive semiconductor etching apparatus, the fabrication cost thereof is hard to reduce.

Therefore, the field concerned is desirous to develop an organic field effect transistor, which can be fabricated with a simple process, to implement the next generation soft electronics and display technology.

SUMMARY OF THE INVENTION

For general organic field effect transistors, the distance between the source and the drain is hard to reduce. Further, the photolithographic technology is hard to obtain a sub-micron channel length in an organic semiconductor. Therefore, the present invention proposes a vertical organic transistor, wherein the distance between electrodes is simply decided by the thicknesses of an organic semiconductor layer; the grid is a metal film which have a plurality of openings; and the dimension and density of the openings can effectively control the characteristics of the transistor.

The present invention also proposes a method for fabricating a vertical organic transistor, wherein the vertical organic transistor is fabricated with simple vapor deposition processes or solution processes; the fabrication of the grid with openings is exempt from the photolithographic process but implemented via a press-printing method or with a vapor deposition mask having the pattern of the grid openings.

According to the present invention, the vertical organic transistor can be formed on a transparent conductive glass or a flexible substrate and thus has the potential to integrate with organic light-emitting elements or soft electronics. Besides, the vertical organic transistor of the present invention has a low operating voltage of less than 3V.

To achieve the abovementioned objectives, the vertical organic transistor proposed by the present invention has an emitter, a grid with openings and a collector sequentially arranged above a substrate, wherein a first organic semiconductor layer separates the emitter and the grid, and a second organic semiconductor layer separates the grid and the collector; carriers are injected by the emitter and pass the grid openings and then reach the collector; and the electric potential distribution between the emitter and the collector can be modulated by the voltages of the grid and the collector. When the voltages of the grid and the collector contribute an energy barrier to the grid openings, few carriers can pass the grid and reach the collector. When there energy barrier is not large or when there is no energy barrier in the grid openings, carriers can pass the grid openings and reach the collector. In other words, the space-charge-limited current contributed by the potential difference between the emitter and the grid openings can decide the collector current. Thus, for a given emitter voltage and a given collector voltage, modulating the grid voltage can effectively control the collector current.

The method for fabricating a vertical organic transistor proposed by the present invention comprises the following steps: providing a substrate; forming an emitter on the substrate; forming an organic semiconductor layer on the emitter and forming a grid inside the organic semiconductor layer and forming a plurality of openings in the grid with a non-photolithographic method, and forming a collector on the organic semiconductor layer, wherein the grid must be separated from the emitter and collector, and the separation may be implemented via the support of an insulating layer or via forming the organic semiconductor layer by two stages. The grid with openings is formed via a vapor deposition method in cooperation with a mask having an opening-forming structure, such as polystyrene spheres, nanospheres, or a patterned insulating layer. Alternatively, a perforate structure is used to fabricate an indenter, and then the indenter is used to form the grid with openings via a press-printing method. Therefore, the entire fabrication process is exempt from using the complicated photolithographic technology.

To enable the objectives, technical contents, characteristics and accomplishments of the present invention to be further understood, the embodiments of the present invention are to be described in detail in cooperation with the drawings below.

DETAILED DESCRIPTION OF THE INVENTION

Below, several embodiments are used to demonstrate the vertical organic transistor and the method for fabricating the same proposed by the present invention.

Embodiment I

Refer to from FIG. 1A to FIG. 1H diagrams schematically showing the process of fabricating the vertical organic transistor according to Embodiment I of the present invention.

Figure 1A:
FIG. 1A to FIG. 1H are diagrams schematically showing the process of fabricating the vertical organic transistor according to Embodiment I of the present invention.

Refer to FIG. 1A. Firstly, a glass substrate 110 having an ITO (Indium-Tin-Oxide) conductive layer 120 is provided. Alternatively, the substrate 110 may also be a flexible substrate.

Figure 1B:
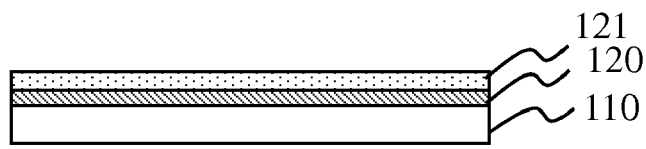

Refer to FIG. 1B. Next, the ITO conductive layer 120 is etched to define an emitter region; then, acetone, isopropyl alcohol and oxygen plasma are sequentially used to clean the ITO glass substrate 110; PEDOT:PSS (Poly(3,4-ethylenedioxythiophene) poly(styrenesulfonate)) is spin-coated on the ITO glass substrate 110 and then annealed in vacuum at a temperature of 200° C. for 10 minutes to obtain a conducting polymer 121 having a thickness of about 50 nm.

Figure 1C:
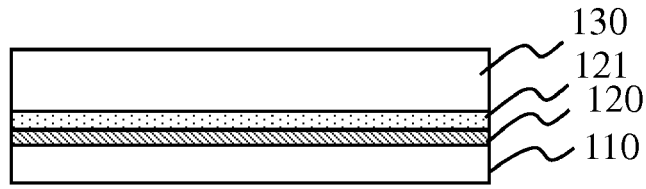

Refer to FIG. 1C. Next, a P3HT (poly-(3-hexylthiophene)) solution is spin-coated on the conducting polymer 121 and then annealed in vacuum at a temperature of 120° C. for 10 minutes to obtain a first organic semiconductor layer 130 having a thickness of about 110 nm, wherein the P3HT solution is obtained via dissolving 1 wt % of P3HT in chloroform. In this embodiment, the ITO emitter (having a work function of 4.7 eV) is coated with the conducting polymer 121 (PEDOT: PSS) having a work function of 5.1 eV; therefore, the interface between the ITO emitter and the P3HT polymer (having an ionization potential of 5 eV) is an ohmic contact. In this embodiment, the polymer material is not limit to P3HT. A low energy-barrier contact may also utilize a hole-transport layer to make carriers be easily injected into the organic semiconductor.

Next, xylene is applied onto the first organic semiconductor layer 130 with a spin-rinsing method to dissolve the P3HT still soluble in xylene. Via the spin-rinsing method, this step is to process the first organic semiconductor layer 130 with an organic solvent to prevent the first organic semiconductor layer 130 from being dissolved in the same organic solvent once more when the organic semiconductor material dissolved in the same organic solvent is spin-coated to form another organic semiconductor layer later. After the spin-rinsing step, the thickness of the first organic semiconductor layer 130 will be reduced, for example from 110 nm to about 20 nm in this embodiment. It is to be noted that the related figures are not drawn to indicate the real proportion but only to illustrate the characteristics of the present invention.

Figure 1D:
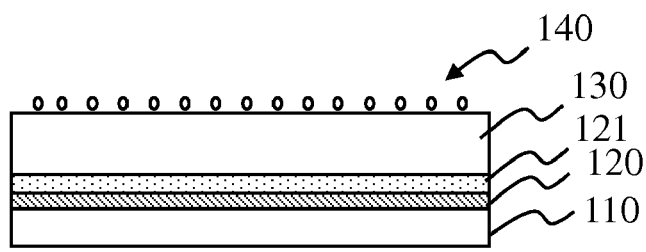

Refer to FIG. 1D. Next, via a spin-coating method, a solution containing dispersed polystyrene spheres is applied onto the substrate 110, which has been processed with the above-mentioned steps. Alternatively, the substrate 110 is directly placed in the solution containing dispersed polystyrene spheres. In such a case, the polystyrene spheres 140 will be attracted by attractive electrostatic force to the surface of the first organic semiconductor layer 130. However, there is repulsive electrostatic force existing between the polystyrene spheres 140, wherein the repulsive electrostatic force comes from the negative charges of the functional groups on the surfaces of the polystyrene spheres 140. Therefore, the polystyrene spheres 140 will not aggregate together at this moment. After soaking in the polystyrene sphere-containing solution for an appropriate period of time, the substrate 110 is taken out from the solution and instantly placed in boiling isopropyl alcohol for 10 sec. and then taken out from the isopropyl alcohol and instantly dried with a nitrogen blow.

It is known from experiments that the process of boiling propyl alcohol has two advantages: (i) the liquid evaporates so fast that the polystyrene spheres 140 do not have sufficient time to aggregate, and the polystyrene spheres 140 are thus still dispersed; and (ii) the surfaces of the polystyrene spheres 140 are partially melted to adhere to P3HT. The soaking time can be used to adjust the density of openings; for a given concentration of solution, the longer the soaking time, the higher the opening density.

Figure 1E:
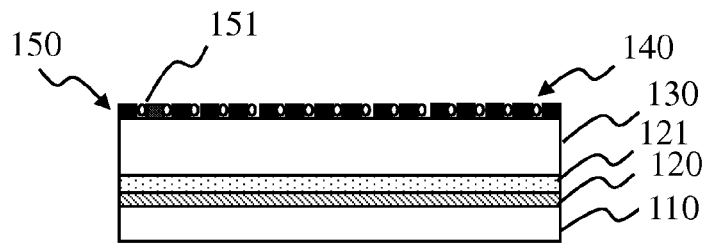

Refer to FIG. 1E. Next, the polystyrene spheres 140 are used as a vapor deposition mask, and aluminum is vapor-deposited with the mask to form a grid 150 having a plurality of openings 151.

Figure 1F:
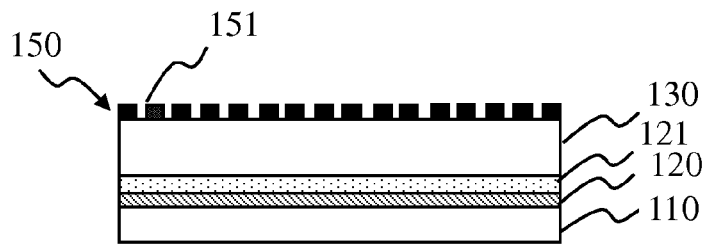

Refer to FIG. 1F. Next, the grid 150 is placed in alcohol, and the polystyrene spheres 140 are shaken away with ultrasonic agitation. Alternatively, the polystyrene spheres 140 may be removed with an adhesive tape.

Figure 1G:
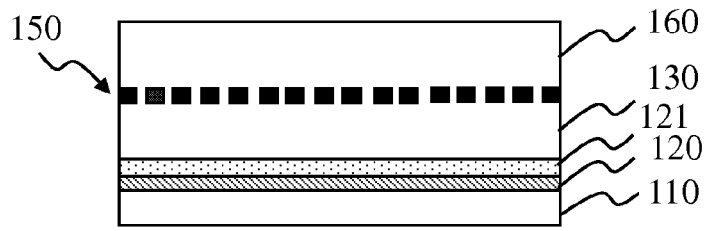

Refer to FIG. 1G. Next, a P3HT solution is spin-coated on the grid 150 to obtain a second organic semiconductor layer 160, wherein the P3HT solution is obtained via dissolving 1 wt % of P3HT in xylene.

Figure 1H:
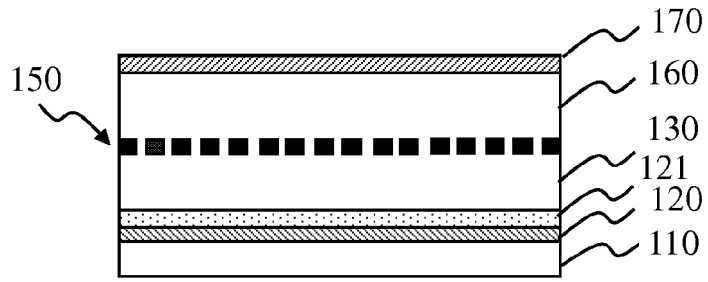

Refer to FIG. 1H. Next, aluminum is vapor-deposited on the second organic semiconductor layer 160 to from a collector 170. Thus, a vertical organic transistor having the structure of ITO/PEDOT:PSS/P3HT/Al grid/P3HT/Al is completed.

Figure 2A:
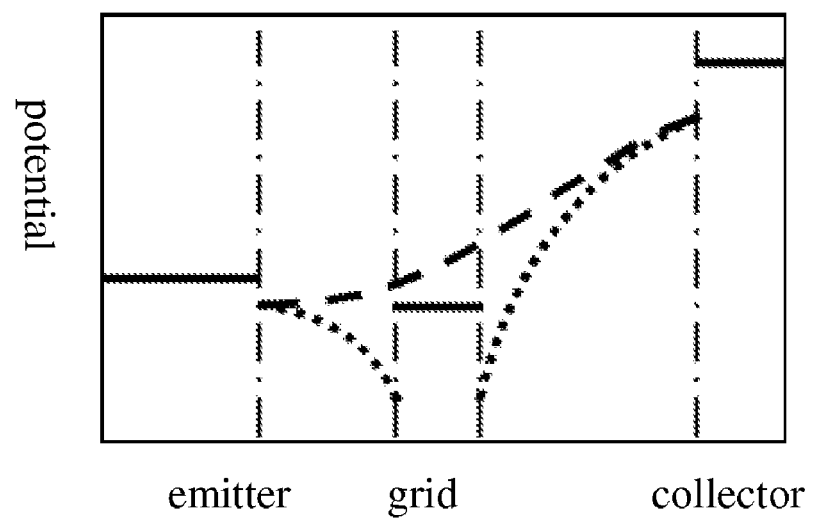
FIG. 2A and FIG. 2B are diagrams schematically showing the operating modes of the vertical organic transistor according to Embodiment I of the present invention.
Figure 2B:
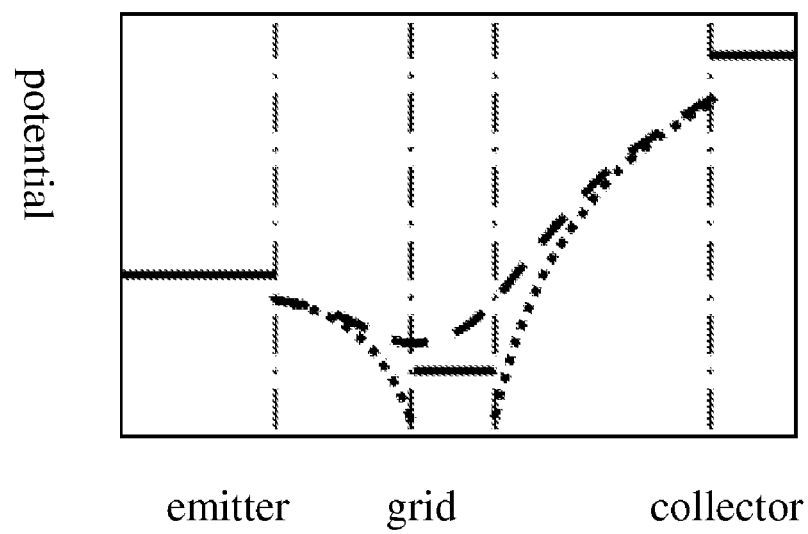

Refer to FIG. 2A and FIG. 2B diagrams schematically showing the operating modes of the vertical organic transistor according to Embodiment I of the present invention. The solid line denotes the work function of a metal or PEDOT:PSS. The dotted line denotes the potential distribution along the path passing the grid. The dashed line denotes the potential distribution along the path pass the opening of the grid.

In the vertical organic transistor, carriers are injected into the first organic semiconductor layer from the emitter and pass the openings of the grid and travel through the second organic semiconductor layer and then reach the collector. The potential distribution between the emitter and the collector can be modulated with the grid voltage. Refer to FIG. 2A. When the grid voltage and the collector voltage establish energy barriers in the first and second organic semiconductor layers, carriers are unlikely to cross the energy barriers. Thus, the carriers reaching the collector are very few, which is referred to as the off state of the organic transistor. Refer to FIG. 2B. When the grid voltage and the collector voltage do not establish energy barriers or establish lower energy barriers in the first and second organic semiconductor layers, carriers can easily cross the energy barriers and reach the collector, which is referred to as the on state of the organic transistor.

Next, several experiments used to measure or analyze the vertical organic transistor of Embodiment I will be introduced.

Below are to be described the results of the experiments for the vertical organic transistor fabricated via spin-coating polystyrene spheres on the substrate and shaking away the polystyrene spheres with ultrasonic agitation.

After the polystyrene spheres are shaken away by ultrasonic agitation, an atomic force microscope is used to observe the topography of the grid. The experimental result shows that the diameter of the openings in the photographs of the atomic force microscope is identical to that of the polystyrene spheres. It is thus proved that ultrasonic agitation does not damage the grid.

Figure 3:
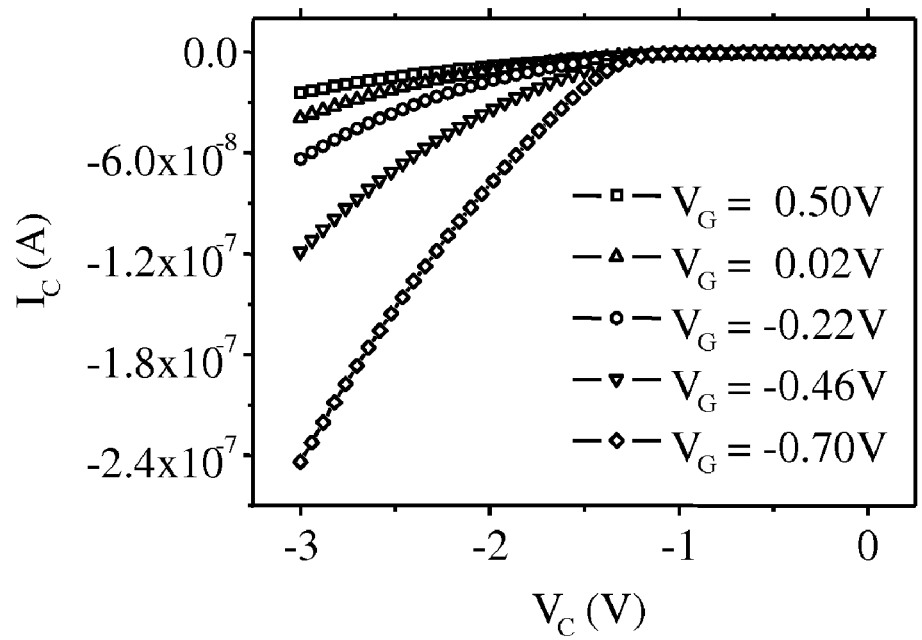
FIG. 3 is a diagram showing the relationships between the collector current $I_C$ and the collector voltage $V_C$ at different grid voltages $V_G$ for a vertical organic transistor with the grid having 200 nm-diameter openings according to Embodiment I of the present invention.

A semiconductor parameter analyzer is used to measure the characteristics of the vertical organic transistor of this embodiment. FIG. 3 shows the relationships between the collector current $I_C$ and the collector voltage $V_C$ at different grid voltages $V_G$ for a vertical organic transistor with the grid having 200 nm-diameter openings. It is thus proved that the grid voltages $V_G$ can indeed control the collector current $I_C$ in the vertical organic transistor of Embodiment I. Besides, the current gain thereof is 506.

Figure 4:
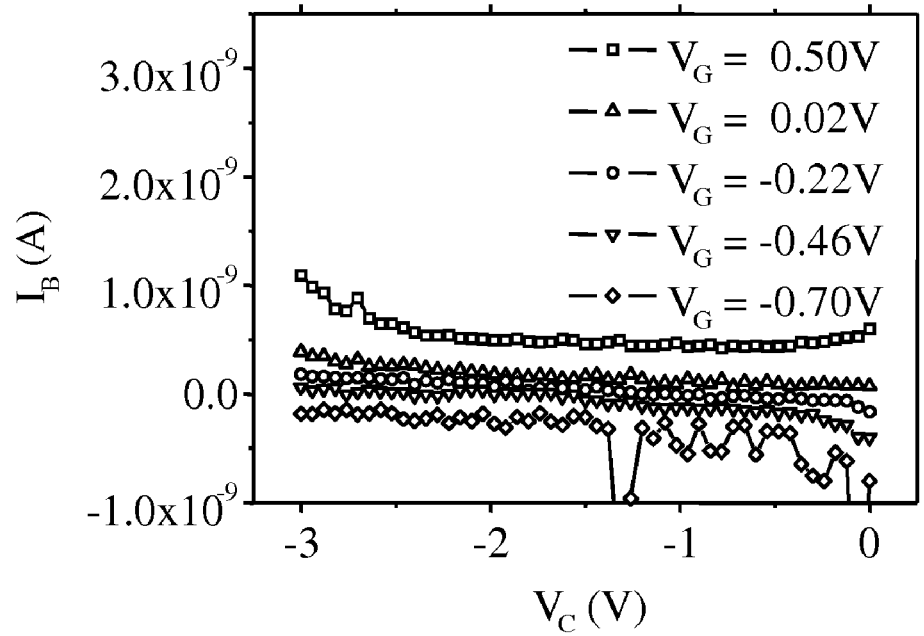
FIG. 4 is a diagram showing the relationships between the grid current $I_G$ and the collector voltage $V_C$ at different grid voltages $V_G$ for a vertical organic transistor with the grid having 200 nm-diameter openings according to Embodiment I of the present invention.

FIG. 4 shows the relationships between the grid current $I_G$ and the grid collector voltage $V_C$ at different grid voltages $V_G$ for a vertical organic transistor with the grid having 200 nm-diameter openings. From FIG. 4, it can be seen that the grid current $I_G$ is very small in the whole working range of the operating factors, and most of the carriers the emitter injects reach the collector.

Figure 5:
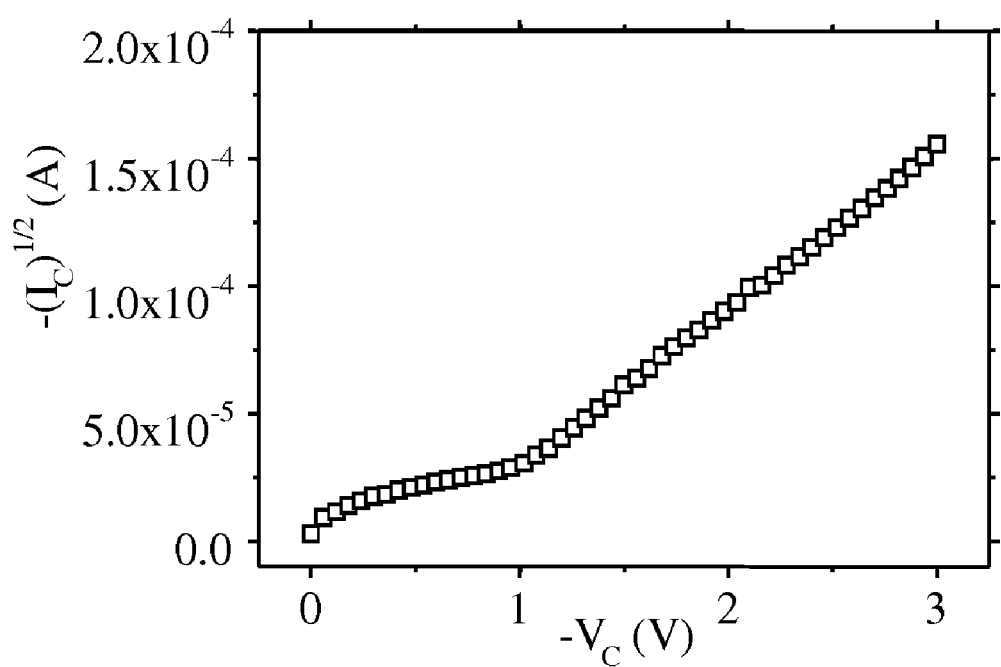
FIG. 5 is a diagram showing the relationships between the square root of the collector current $I_C$ and the collector voltage $V_C$ under a grid voltage $V_G$ of 0.5V for a vertical organic transistor with the grid having 200 nm-diameter openings according to Embodiment I of the present invention.

FIG. 5. shows the relationships between the square root of the collector current $I_C$ and the collector voltage $V_C$ under a grid voltage $V_G$ of 0.5V. It is thus proved that the current which space-charge-limited transistor modulated is the space-charge-limited current.

Figure 6:
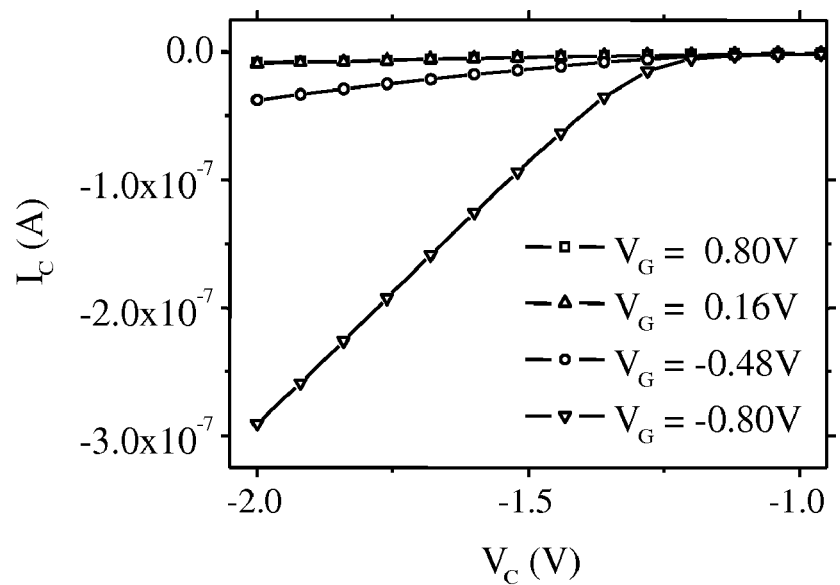
FIG. 6 is a diagram showing the relationship between the collector current $I_C$ and the collector voltage $V_C$ at different grid voltages $V_G$ for the vertical organic transistors with the grid having 100 nm-diameter openings according to Embodiment I of the present invention.
Figure 7:
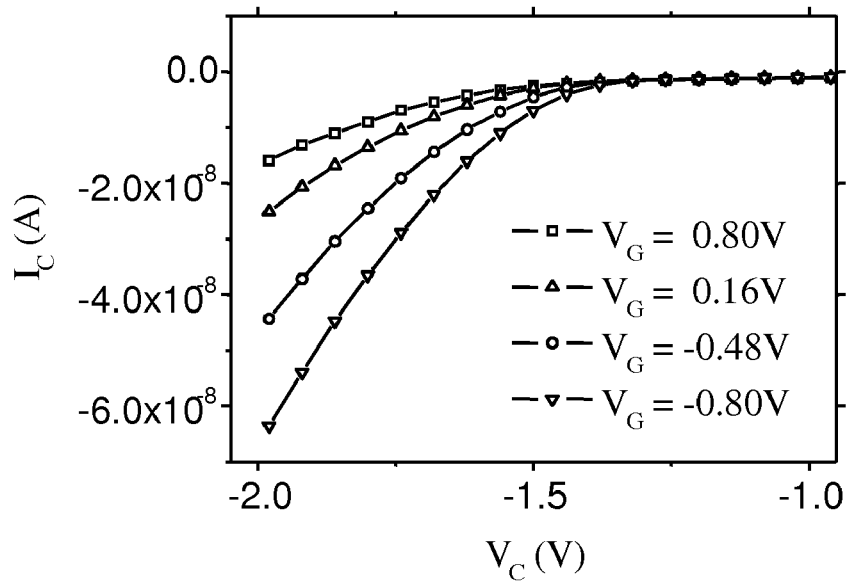
FIG. 7 is a diagram showing the relationship between the collector current $I_C$ and the collector voltage $V_C$ at different grid voltages $V_G$ for the vertical organic transistors with the grid having 500 nm-diameter openings according to Embodiment I of the present invention.

FIG. 6 and FIG. 7 separately show the relationships between the collector current $I_C$ and the collector voltage $V_C$ at different grid voltages $V_G$ for the vertical organic transistors respectively with the grid having 100 nm-diameter openings and the grid having 500 nm-diameter openings. In comparison with FIG. 3, the curves almost overlap in FIG. 6 when the positive grid voltage $V_G$ is larger. In comparison with FIG. 3, the collector current $I_C$ will not be reduced to a very low value in FIG. 7 when the positive grid voltage $V_G$ is larger. From FIG. 7, it can be seen that no matter whether in the on state or the off state, the current of the vertical organic transistor does not vary obviously.

Figure 8:
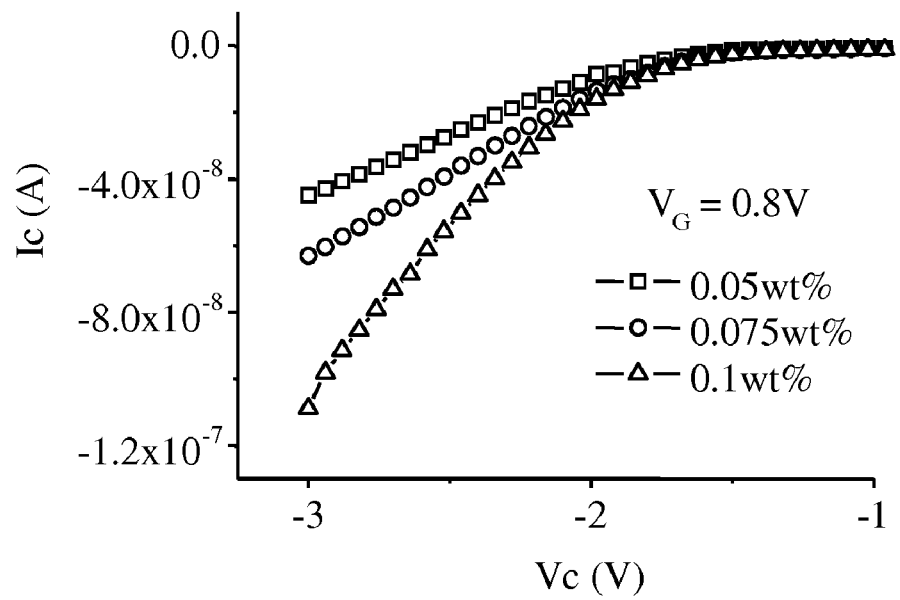
FIG. 8 is a diagram showing the relationship between the collector current $I_C$ and the collector voltage $V_C$ under a grid voltage $V_G$ of 0.8V for the vertical organic transistor with the grid having 500 nm-diameter openings formed with different densities of polystyrene sphere solutions according to Embodiment I of the present invention.
Figure 9:
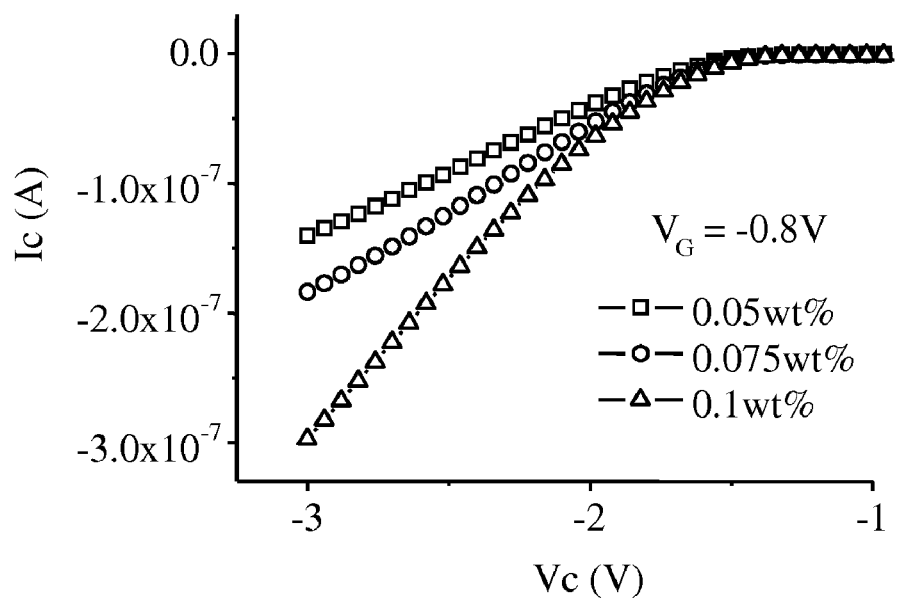
FIG. 9 is a diagram showing the relationship between the collector current $I_C$ and the collector voltage $V_C$ under a grid voltage $V_G$ of −0.8V for the vertical organic transistor with the grid having 500 nm-diameter openings formed with different densities of polystyrene sphere solutions according to Embodiment I of the present invention.

Different densities of polystyrene sphere solutions may be spin-coated to form different vapor deposition masks. A low-concentration solution will form a grid with fewer openings, and a high-concentration solution will form a grid with more openings. More openings mean more current channels, and more current channels imply a higher collector current $I_C$. FIG. 8 and FIG. 9 separately show the relationships between the collector current $I_C$ and the collector voltage $V_C$ under the grid voltages $V_G$ of 0.8V and −0.8V for the vertical organic transistors respectively with the grid having 500 nm-diameter openings formed with different densities of polystyrene sphere solutions.

Below are to be described the results of the experiments for the vertical organic transistor fabricated via placing the substrate in a polystyrene sphere solution and processing the substrate with boiling isopropyl alcohol treatment and removing the polystyrene spheres with an adhesive tape.

Figure 10:
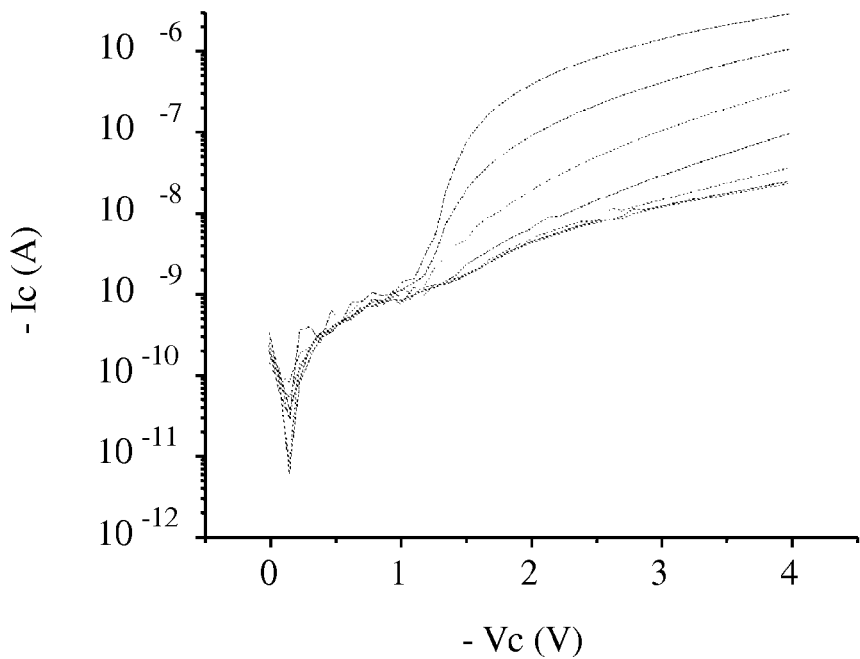
FIG. 10 is a semi-logarithmic chart showing the relationships between the collector current $I_C$ and the collector voltage $V_C$ at different grid voltages $V_G$ for the vertical organic transistor with 100 nm grid openings formed with a 0.05 wt % 1000 Å polystyrene sphere solution according to Embodiment I of the present invention.
Figure 11:
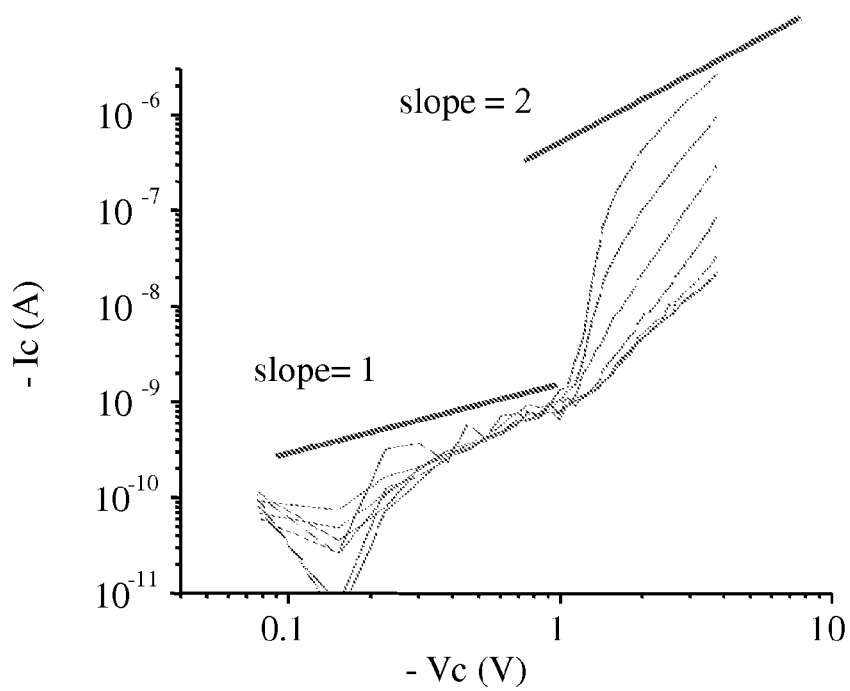
FIG. 11 is a log-log chart showing the relationships between the collector current $I_C$ and the collector voltage $V_C$ at different grid voltages $V_G$ for the vertical organic transistor with 100 nm grid openings formed with a 0.05 wt % 1000 Å polystyrene sphere solution according to Embodiment I of the present invention.

FIG. 10 and FIG. 11 show the characteristics of the vertical organic transistor with 100 nm grid openings formed with a 0.05 wt % 1000 Å polystyrene sphere solution. FIG. 10 is a semi-logarithmic chart showing the relationships between the collector current $I_C$ and the collector voltage $V_C$ at different grid voltages $V_G$ for the vertical organic transistor, wherein the curves are top-down for the grid voltages $V_G$ of −0.1, −0.8, −0.6, −0.4, −0.2, 0.0, and 0.2V, and the on/off current ratio is 122.6. FIG. 11 is a log-log chart showing the relationships between the collector current $I_C$ and the collector voltage $V_C$ at different grid voltages $V_G$ for the vertical organic transistor, wherein a line of slope 1 and a line of slope 2 are drawn in the chart; the line of slope 1 indicates that the relationship between current and voltage obeys the Ohm's rule at a lower voltage; the line of slope 2 indicates that the operating current of the transistor is the space-charge-limited current.

Figure 12:
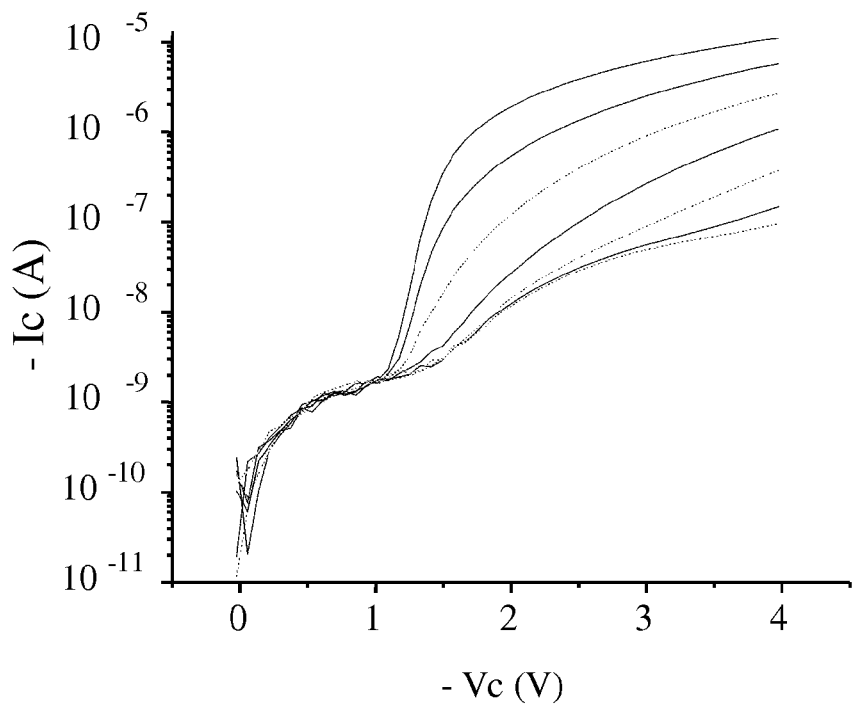
FIG. 12 is a semi-logarithmic chart showing the relationships between the collector current $I_C$ and the collector voltage $V_C$ at different grid voltages $V_G$ for the vertical organic transistor with 200 nm grid openings formed with a 0.08 wt % 2000 Å polystyrene sphere solution according to Embodiment I of the present invention.
Figure 13:
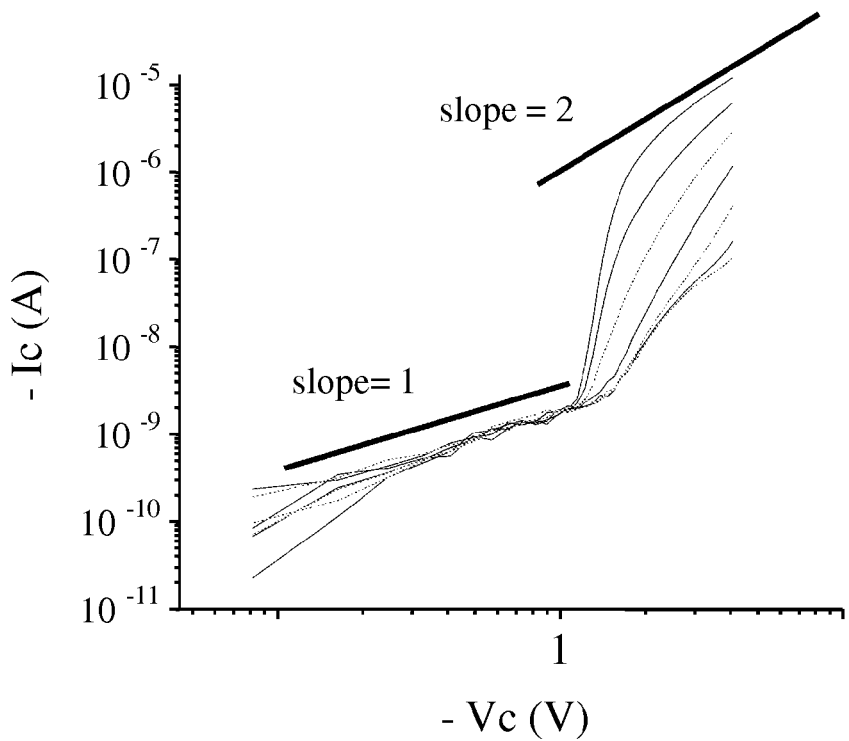
FIG. 13 is a log-log chart showing the relationships between the collector current $I_C$ and the collector voltage $V_C$ at different grid voltages $V_G$ for the vertical organic transistor with 200 nm grid openings formed with a 0.08 wt % 2000 Å polystyrene sphere solution according to Embodiment I of the present invention.

FIG. 12 and FIG. 13 show the characteristics of the vertical organic transistor with 200 nm grid openings formed with a 0.08 wt % 2000 Å polystyrene sphere solution. FIG. 12 is a semi-logarithmic chart showing the relationships between the collector current $I_C$ and the collector voltage $V_C$ at different grid voltages $V_G$ for the vertical organic transistor, wherein the curves are top-down for the grid voltages $V_G$ of −0.9, −0.4, 0.1, 0.6, 1.1, 1.6, and 2.1V, and the on/off current ratio is 116.

FIG. 13 is a log-log chart showing the relationships between the collector current $I_C$ and the collector voltage $V_C$ at different grid voltages $V_G$ for the vertical organic transistor, wherein a line of slope 1 and a line of slope 2 are drawn in the chart; the line of slope 1 indicates that the relationship between current and voltage obeys the Ohm's rule at a lower voltage; the line of slope 2 indicates that the operating current of the transistor is the space-charge-limited current.

Figure 14:
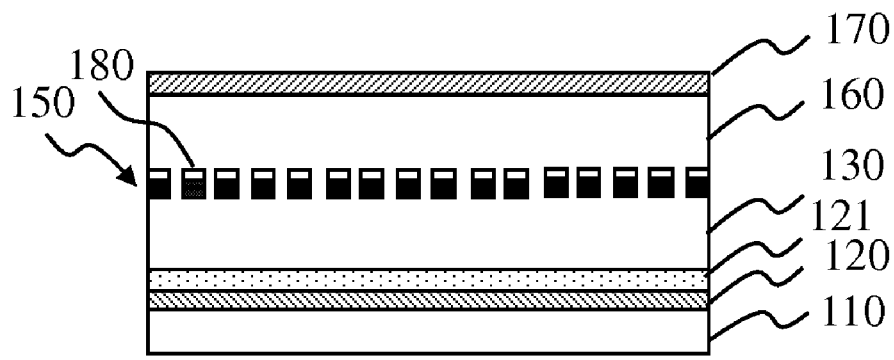
FIG. 14 and FIG. 15 are respectively diagrams schematically showing different exemplifications of the insulating layer according to Embodiment I of the present invention.
Figure 15:
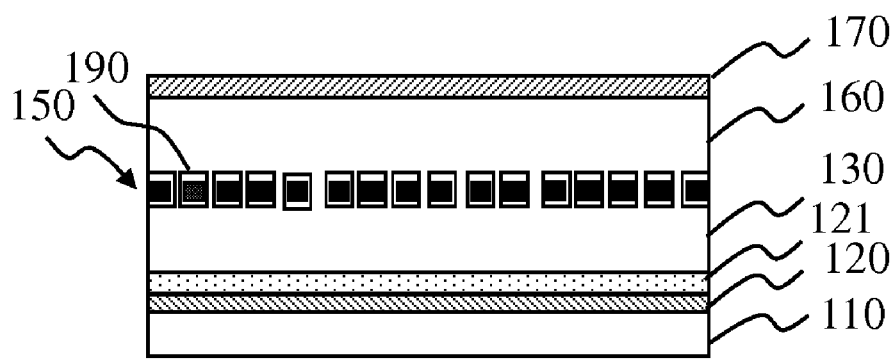

In this embodiment, the vertical organic transistor may further comprise an insulating layer. Refer to FIG. 14. An insulating layer 180 is formed on the grid 150 to reduce the leakage current between the grid 150 and the collector 170. Refer to FIG. 15. An insulating layer 190 is formed around the grid 150 to reduce the leakage current between the grid 150 and the collector 170.

Below, Embodiments II~IV will describe other exemplifications of the vertical organic transistor with a grid having openings.

Embodiment II

Refer to from FIG. 16A to FIG. 16D diagrams schematically showing the process of fabricating the vertical organic transistor according to Embodiment II of the present invention.

Figure 16A:
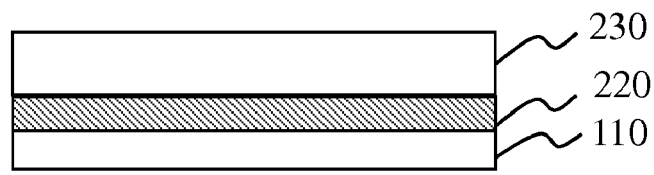
FIG. 16A to FIG. 16D are diagrams schematically showing the process of fabricating the vertical organic transistor according to Embodiment II of the present invention.
Figure 16B:
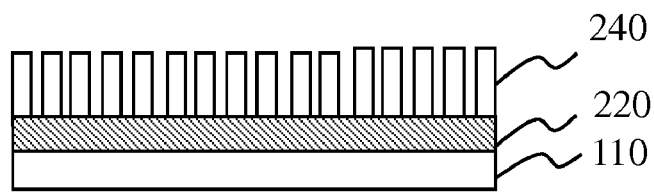
Figure 16C:
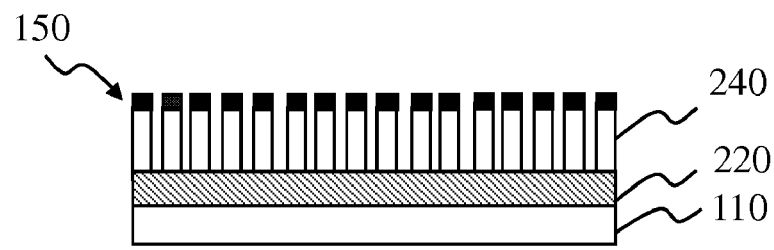
Figure 16D:
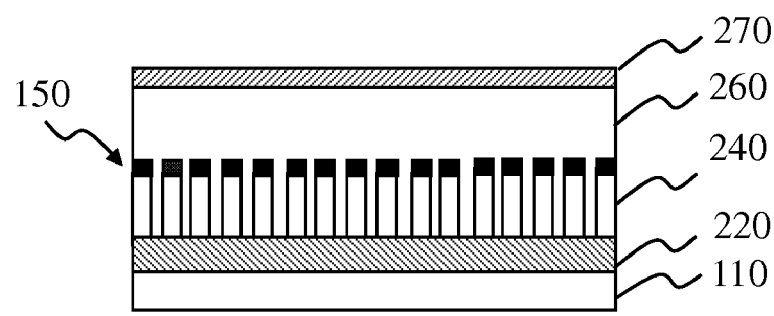

Refer to FIG. 16A. A copolymer is spin-coated on the emitter 220 to form an insulating layer 230. Refer to FIG. 16B. Next, the insulating layer 230 is fabricated into a perforate structure 240. Refer to FIG. 16C. Next, a metal is deposited on the perforate structure 240 to form a grid 250 with openings. Refer to FIG. 16D. Next, an organic semiconductor material is spin-coated on the grid 250 to form an organic semiconductor layer 260, and then a metal is deposited on the organic semiconductor layer 260 to form a collector 270. Thus, a vertical organic transistor is completed.

In this embodiment, the insulating layer 230 may be an aluminum oxide layer, wherein aluminum is vapor-deposited on the emitter 220, and the aluminum layer is processed with an appropriate method, such as an anodic treatment, to form a perforate aluminum oxide structure.

Embodiment III

Refer to from FIG. 17A to FIG. 17F diagrams schematically showing the process of fabricating the vertical organic transistor according to Embodiment III of the present invention.

Figure 17A:
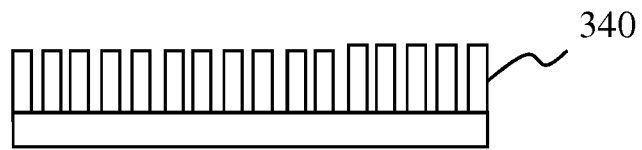
FIG. 17A to FIG. 17F are diagrams schematically showing the process of fabricating the vertical organic transistor according to Embodiment III of the present invention.
Figure 17B:
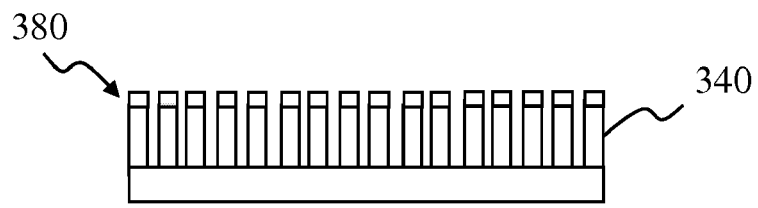
Figure 17C:
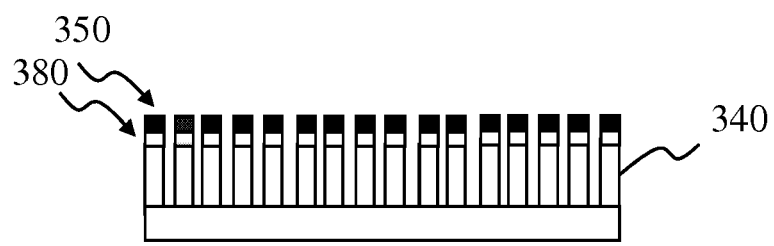
Figure 17D:
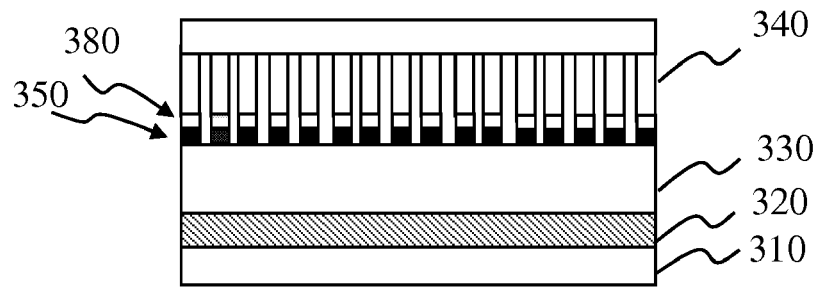
Figure 17E:
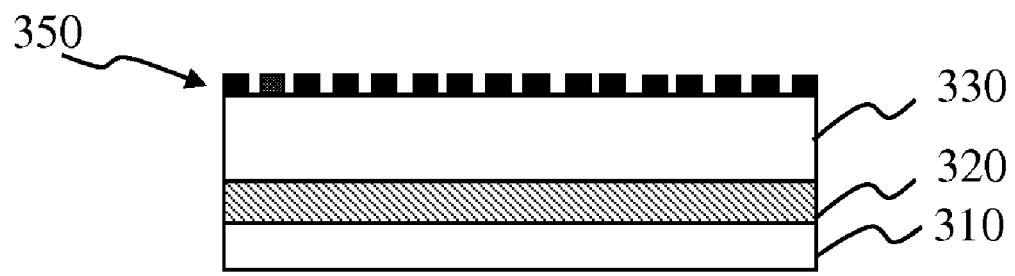
Figure 17F:
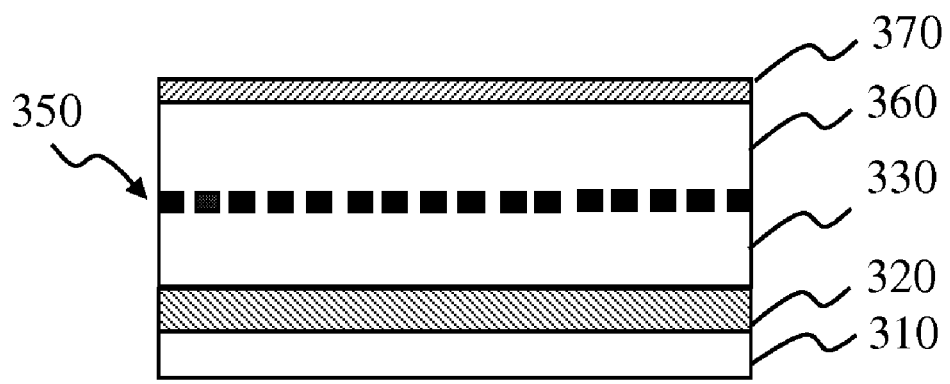

Refer to FIG. 17A. A material on another substrate or the another substrate itself is appropriately processed to form a perforate structure 340. Refer to FIG. 17B. Next, a sacrificial layer 380 is formed on the perforate structure 340. Refer to FIG. 17C. Next, a metal is deposited on the sacrificial layer 380 to form a grid 350. Refer to FIG. 17D. Next, the grid-deposited structure is flipped to overlay the substrate 310 having an emitter 320 and a first organic semiconductor layer 330. Refer to FIG. 17E. Next, the grid 350 is stuck to the first organic semiconductor layer 330. Refer to FIG. 17F. Next, an organic semiconductor material is spin-coated on the grid 350 to form a second organic semiconductor layer 360. Then, a metal is vapor-deposited on the second organic semiconductor layer 360 to form a collector 370. Thus, a vertical organic transistor is completed.

Embodiment IV

Refer to from FIG. 18A to FIG. 18F diagrams schematically showing the process of fabricating the vertical organic transistor according to Embodiment IV of the present invention.

Figure 18A:
FIG. 18A to FIG. 18F are diagrams schematically showing the process of fabricating the vertical organic transistor according to Embodiment IV of the present invention.
Figure 18B:
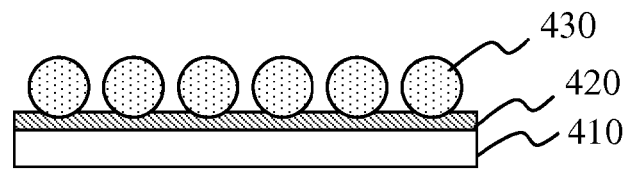
Figure 18C:
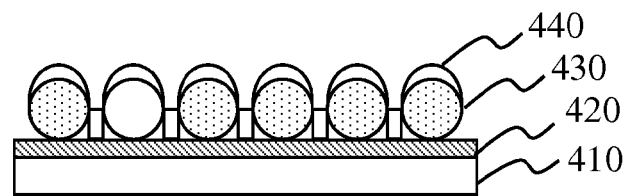
Figure 18D:
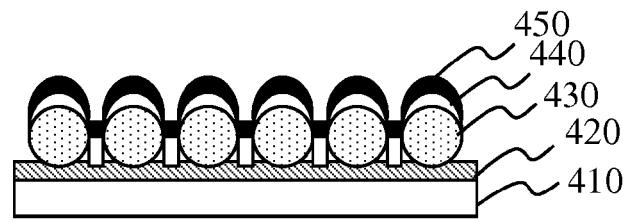
Figure 18E:
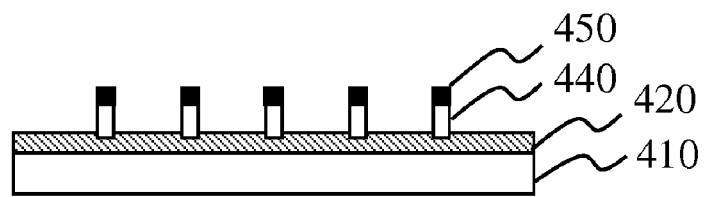
Figure 18F:
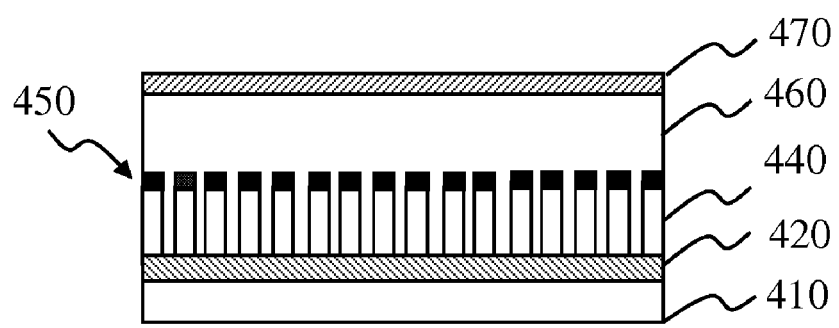

Refer to FIG. 18A. An emitter 420 is deposited on a substrate 410. Refer to FIG. 18B. Next, nanospheres 430 is placed on the emitter 420 and used as a vapor deposition mask. Refer to FIG. 18C. Next, an insulating layer 440 is vapor-deposited on the emitter 420 and the nanospheres 430. Refer to FIG. 18D. Next, a grid 450 is vapor-deposited on the insulating layer 440. Refer to FIG. 18E. Next, the nanospheres 430 are removed to from a grid 450 with openings. Refer to FIG. 18F. Next, an organic semiconductor material is spin-coated on the grid 450 and the emitter 420 to form an organic semiconductor layer 460. Then, a collector 470 is deposited on the organic semiconductor layer 460. Thus, a vertical organic transistor is completed.

In summary, the present invention proposes a vertical organic transistor and a method for fabricating the same, wherein the vertical organic transistor has a vertical structure of emitter/organic semiconductor layer/grid with openings/organic semiconductor layer/collector; the channel length is simply decided by the thickness of the organic semiconductor layers; the collector current depends on the space-charge-limited current contributed by the potential difference between the emitter and the openings of the grid; and the grid voltage can thus effectively control the collector current.

Therefore, the present invention has the advantages of low operating voltage, effective current modulation, simple grid fabrication, clear definition of electrodes and current channels, carrier injection via the ohmic contact, and space-charge-limited current. Besides, as the vertical organic transistor of the present invention adopts an organic semiconductor material, it can integrate with a flexible substrate to attain a lightweight effect.

Those described above are the embodiments to exemplify the present invention. However, it is not intended to limit the scope of the present invention. Any equivalent modification or variation according to the spirit of the present invention is to be also included within the scope of the present invention, which depends on the claims stated below.

What is claimed is:

1. A vertical organic transistor, comprising:
   a substrate;
   an emitter formed on said substrate and said emitter is made of indium tin oxide;
   a conducting polymer formed on said emitter;
   a collector formed above said emitter;
   a grid interposed between said emitter and said collector and having a plurality of openings; and
   a first organic semiconductor layer and a second organic semiconductor layer interposed respectively between said conducting polymer and said grid and between said grid and said collector.

2. The vertical organic transistor according to claim 1, wherein said substrate is a conductive glass substrate or a flexible substrate.

3. The vertical organic transistor according to claim 1, wherein said conducting polymer is a conducting polymer of PEDOT:PSS (Poly(3,4-ethylenedioxythiophene) poly(styrenesulfonate)).

4. The vertical organic transistor according to claim 1, wherein said collector is made of aluminum.

5. The vertical organic transistor according to claim 1, wherein said grid is made of aluminum.

6. The vertical organic transistor according to claim 1, wherein said first organic semiconductor layer and said second organic semiconductor layer are made of the same organic semiconductor material.

7. The vertical organic transistor according to claim 6, wherein said organic semiconductor material is P3HT (poly-(3-hexylthiophene)).

8. The vertical organic transistor according to claim 1, further comprising an insulating layer, which is arranged in one side of said grid or around said grid.

9. The vertical organic transistor according to claim 8, wherein said insulating layer is made of a copolymer or aluminum oxide.

* * * * *